United States Patent [19]

Momodomi et al.

[11] Patent Number: 4,875,195
[45] Date of Patent: Oct. 17, 1989

[54] SEMICONDUCTOR DEVICE WITH A REFERENCE VOLTAGE GENERATOR

[75] Inventors: Masaki Momodomi, Yokohama; Koji Sakui, Tokyo, both of Japan

[73] Assignee: Kabushiki Kaisha Toshiba, Kawasaki, Japan

[21] Appl. No.: 46,155

[22] Filed: May 5, 1987

[30] Foreign Application Priority Data

May 6, 1986 [JP] Japan .................................. 61-103404

[51] Int. Cl.[4] ................................................ G11C 8/00
[52] U.S. Cl. ......................... 365/230.08; 365/189.07; 307/358
[58] Field of Search ................ 365/189, 230; 307/356, 307/358, 475

[56] References Cited

U.S. PATENT DOCUMENTS 4,477,736 10/1984 Onishi .................................. 307/475

FOREIGN PATENT DOCUMENTS

56-57336 5/1981 Japan .

Primary Examiner—James W. Moffitt
Attorney, Agent, or Firm—Oblon, Spivak, McClelland, Maier & Neustadt

[57] ABSTRACT

A highly-integrated semiconductor dynamic random-acess memory is disclosed wherein a reference voltage-generating circuit is connected by voltage-transmission lines to a row-address buffer and a column-address buffer. The reference voltage-generating circuit receives a power-supply voltage and generates first and second reference voltages which are different, by different values, from an ordinary reference potential level. These reference voltages are supplied to the address buffers through the voltage-transmission lines. The first and second reference voltages are adjusted to compensate for a potential deviation which occurs on the voltage-transmission lines. Therefore, even when either reference voltage fluctuates due to an increase in the coupling capacitance between the substrate of the dynamic random-access memory, on the one hand, and the voltage-transmission lines, on the other, both address buffers are prevented from malfunctioning.

21 Claims, 7 Drawing Sheets

SEMICONDUCTOR DEVICE WITH A REFERENCE VOLTAGE GENERATOR

BACKGROUND OF THE INVENTION

The present invention relates to a semiconductor device and, more particularly, to a semiconductor integrated circuit with a high integration density, which has a circuit for generating a d.c. reference voltage.

The higher the integration density of a semiconductor circuit device, the smaller are the elements of the circuit device. The sizes of the circuit elements are now at submicron level. In order to mount as many submicron-elements as possible on a chip substrate, the chip substrate needs to be large. However, the width of the chip substrate cannot be increased because of the limitations imposed on the packaging sizes of semiconductor devices. Therefore, the chip substrate is elongated. For example, the chip substrate of a 4-megabit dynamic random-access memory (DRAM), which has recently been developed, has a width of 6.9 mm and a length of 16.11 mm. This substrate is, so to speak, slim; its length is about 2.3 times its width.

The longer the chip substrate, the longer the inner wiring lines extending in the lengthwise direction of the substrate. When a great number of these wiring lines are used, they must be fine and juxtaposed at short intervals. As a result, the parasitic capacitances, such as the stray capacitance among these lines and the coupling capacitance between the substrate and these lines, are undesirably increased. Consequently, the internal impedance of the semiconductor circuit device increases, inevitably degrading the operating characteristics of the semiconductor circuit device.

Semiconductor DRAMS are known which have a circuit for generating a reference d.c. voltage for row- and column-address buffer circuits. To these DRAMs the above-mentioned phenomenon represents a very serious problem. This is because, in these DRAMs, an increase in the internal impedance directly reduces the reliability of the data-access operation. The longer and finer the wiring lines for applying the reference d.c. voltage Vref to the row- and column-address buffer circuits, the more the coupling-capacitance ratio rc for the substrate and these voltage-applying lines will increase. As a result, the potential of the voltage-applying lines (i.e., the reference voltage Vref for the address buffer circuit) fluctuates considerably when the potential of the bit lines changes from ground potential Vss to power-supply voltage Vcc, or vice versa. This large potential-fluctuation of the lines adversely reduces the operating tolerance of the address buffer circuits which, consequently, are more likely to malfunction, with the result that data cannot be correctly written into, or correctly read out from, the DRAM.

The existing 1-metabit DRAM has, in addition to redundant wiring lines, 8192 bit lines, reference-voltage transmission lines for applying the reference d.c. voltage to the sense amplifiers used in the address buffer and the data-input buffer, power-supply lines, and grounding lines. (Each bit line has 128 memory cells are connected thereto.) The DRAM is divided-driven in such a manner that the memory cells of this DRAM are divided into several groups of cell arrays. When the DRAM is set in a data-accessing mode, only one selected group of cell arrays is enabled. The cell arrays of the selected group are therefore charged during a precharge period, and are discharged during an active period. The cell arrays of the non-selected groups remain inoperative, and power is saved during the data-access operation of the DRAM.

In the DRAM having the structure described above, the boostrap ratio rB between each bit line and the substrate is approximately 14%. Hence, when the ground potential Vss and the power-supply voltage are 0 volts and 5 volts, respectively, the fluctuation Vsub of the substrate potential $\Delta Vsub$, which occurs as the potential of each bit line changes from the ground potential Vss to the power-supply voltage Vcc, or vice versa, can be given as:

$$\Delta Vsub = (Vcc - Vss) \cdot rB = \pm 0.7 \ (V) \tag{1}$$

The coupling-capacitance ratio rc between the substrate, on the one hand, and the reference voltage-applying lines, on the other, will increase to as much as 0.58 when the width of the wiring lines is reduced, more wiring lines are used, and the wiring lines are juxtaposed at shorter intervals. When the substrate potential Vsub changes within the range of $\pm 0.7$ volts, the fluctuation $\Delta Vref$ of the potential of the voltage-applying lines will be:

$$\Delta Vref = \Delta Vsub \cdot rc = \pm 0.41(V) \tag{2}$$

When the reference d.c. voltage Vref is 1.6 volts, this voltage will change considerably within the range of 1.19 to 2.01 volts as the potential of any bit line changes from the ground potential Vss to the power-supply voltage Vcc, or vice versa, due to the discharging of the bit line during the active-mode operation of the DRAM, or due to the charging of the bit line during the precharge-mode operation of the DRAM. When the reference potential Vref fluctuates as much as this, the margin for the logical-level discrimination within the address buffer circuit will greatly diminish, despite the fact that the range of the logical "HIGH" and "LOW" levels of the externally input address signals is fixed. In the worst case, this margin is nil. Hence, there is a strong possibility that both the row-address buffer circuit and the column-address buffer circuit will operate erroneously. In such circumstances, it is unlikely that a correct data-access operation can be achieved in the DRAM.

SUMMARY OF THE INVENTION

It is therefore an object of the present invention to provide a new and improved semiconductor device which can operate reliably even if its internal impedance increases as a result of measures taken to increase its integration density.

It is another object of the present invention to provide a new and improved semiconductor integrated circuit device having a reference voltage-generating circuit which can enable the other internal circuits of the device to perform reliable logic operations even if the internal impedance of the device increases as a result of measures taken to increase the integration density of the device.

In accordance with the above objects, the present invention is addressed to a specific semiconductor device which has a first circuit unit provided on a substrate, for determining the logical level of an input voltage, and a second circuit unit also formed on the substrate and connected to the first circuit unit by wiring lines. A power-supply voltage is applied to the second circuit unit, which then generates a voltage lower than the power-supply voltage. The output voltage of the second circuit unit is applied to the first circuit, and is used as a reference voltage to determine the logical level of the input voltage. The reference voltage is adjusted to compensate for a potential deviation on the wiring lines. Therefore, the first circuit unit correctly determines the logical level of the input voltage, even when the reference voltage on the wiring lines fluctuates.

The present invention and its objects and advantages will become more apparent from the following detailed description of the preferred embodiments of the invention.

BRIEF DESCRIPTION OF THE DRAWINGS

In the detailed description of the preferred embodiments of the invention, presented below, reference will be made to the accompanying drawing of which.

DETAILED DESCRIPTION OF THE PREFERRED EMBODIMENTS

Figure 1:
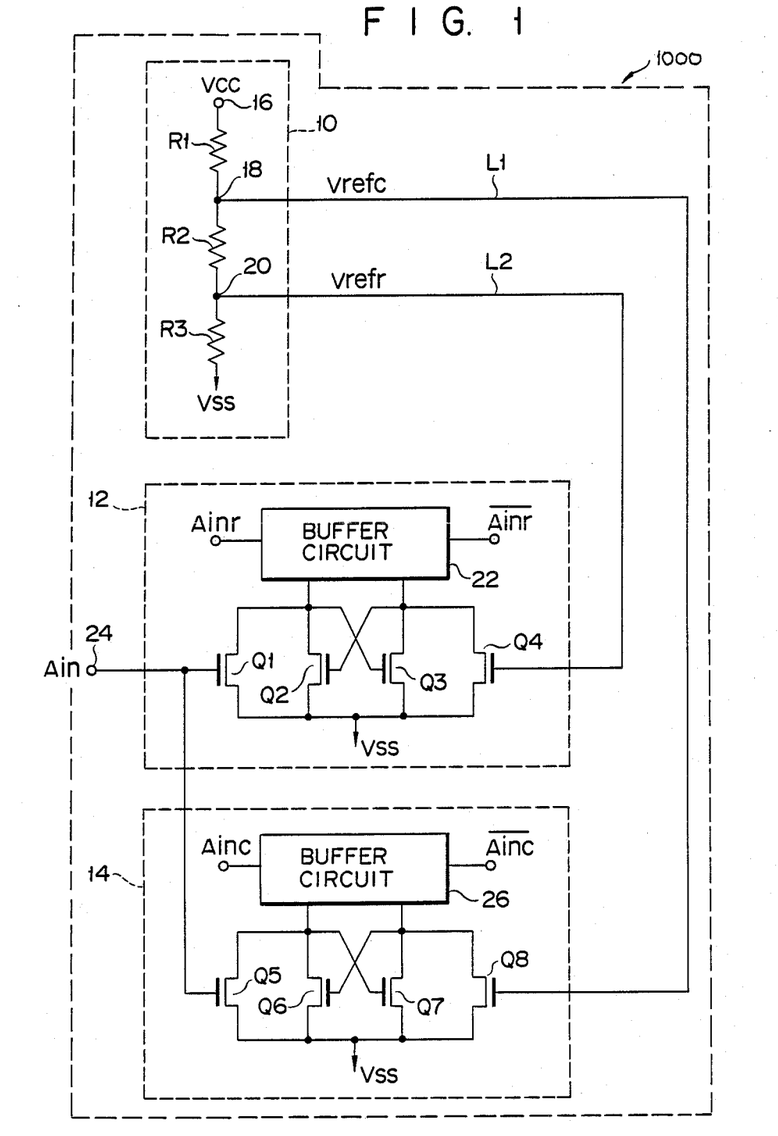
FIG. 1 is a diagram showing a circuit configuration having row and column address buffers and a reference voltage generating circuit therefor, which are provided in a semiconductor dynamic random access memory (DRAM) in accordance with one preferred embodiment of this invention.

A semiconductor dynamic random-access memory (hereinafter referred to as "DRAM"), which is one preferred embodiment of the invention, will now be described with reference to FIG. 1. This DRAM operates in normal mode or nibble mode, wherein one set of row-address signals is input to row-address buffer 12 and one set of column-address signals is input to column-address buffer 14, during every active-mode operation.

Reference voltage-generating circuit 10 is provided on a silicon chip substrate 1000. Circuit 10 (i.e. which make up a first and second circuit means) is connected to row-address buffer circuit 12 and also to column-address buffer circuit 14, which are provided on the chip substrate, too. Circuit 10 supplies a reference d.c. voltage Vrefr to buffer circuit 12 through reference-voltage transmission line L2, and supplies a reference d.c. voltage Vrefc to buffer circuit 14 through reference-voltage transmission line L1. Both lines L1 and L2 are thin and long since the DRAM has a high integration density. Hence, the coupling capacitance between either reference-voltage transmission line and the other wiring lines and/or the chip substrate is relatively large. Consequently, the DRAM has a high internal impedance.

Reference voltage-generating circuit 10 includes three resistors R1, R2 and R3 coupled in series between a ground potential Vss and the terminal to which a power-supply voltage Vcc is applied. The node 18 of resistors R1 and R2 functions as a terminal for providing the reference d.c. voltage Vrefc for column-address buffer circuit 14. The node 20 of resistors R2 and R3 functions as a terminal for providing the reference d.c. voltage Vrefr for low-address buffer circuit 12.

Row-address buffer circuit 12 is of the known type which includes buffer circuit 22 and metal oxide semiconductor field-effect transistors (hereinafter called "MOSFETs" or "FETs") Q1 to Q4. The reference d.c. voltage Vrefr supplied from circuit 10 is applied to the gate electrode of FET Q4. The gate electrode of FET Q1 is coupled to terminal 24 to which an input address signal Ain is supplied. Row-address buffer circuit 12 compares the address input signal Ain with the reference voltage Vrefr, thereby determining the logical level of signal Ain.

Column-address buffer circuit 14 is also of the known type which includes buffer circuit 26 and FETs Q5 to Q8. The reference d.c. voltage Vrefc supplied from circuit 10 is applied to the gate electrode of FET Q8. The gate electrode of FET Q5 is connected to address input terminal 24. Column-address buffer circuit 14 compares the address input signal Ain with the reference voltage Vrefc, thereby determining the logical level of the signal Ain.

Resistors R1, R2, and R3, which form reference voltage-generating circuit 10, are made of known polycrystalline silicon layers. Resistors R1 has a resistance of 25.1 kilohms, resistor R2 has a resistance of 6.9 kilohms, and resistor R3 has a resistance of 10 kilohms. Therefore, when the power-supply voltage Vcc of the DRAM is 5 volts, the reference voltages Vrefr and Vrefc are 1.19 volts and 2.01 volts, respectively. In other words, the ordinary reference voltage for address buffers, is set at 1.6 volts, but, in this embodiment, the reference voltage Vrefr for row-address buffer circuit 12 is lower than 1.6 volts by the following value:

$$V_{sub} \times rc \quad (3)$$

When the power-supply voltage Vcc is 5 volts, the reference voltage Vrefr is lower than the ordinary reference voltage (i.e., 1.6 volts) by 0.41 volts, since the substrate potential fluctuation $\Delta V_{sub}$ is defined by equation (1). And in this case, the reference voltage Vrefc for column-address buffer circuit 14 is higher than the ordinary reference voltage by 0.41 volts, as can be understood also from equation (3).

Since two different reference voltages, i.e., Vrefr and Vrefc, are constantly supplied to row-address buffer circuit 12 and column-address buffer circuit 14, the margin of logical-level discrimination can be broadened for both address buffer circuits 12 and 14. As a result, neither address buffer circuit malfunctions even when the substrate potential Vsub fluctuates by $\Delta V_{sub}$ as the bit lines (not shown) of the DRAM are charged during the precharge period, or discharged during the data-reading period, and the potentials of reference-voltage transmission lines L1 and L2 are thereby changed. (The value $\Delta V_{sub}$ is ±0.7 volts when the boostrap ratio rB is 14%, as is evident from equation (1).) Therefore, the operating reliability of this highly integrated DRAM can be improved.

More specifically, upon lapse of 30 to 40 nanoseconds after the row-address strobe signal $\overline{RAS}$ supplied to this DRAM has fallen to logic "LOW" level, a sense amplifier (not shown) of the known type, which is coupled to a selected bit line, becomes operative, whereby the selected bit line is discharged to read data from the memory cells coupled to this bit line. At this time, the substrate potential Vsub falls by the value given by equation (1). Due to the coupling capacitance between the substrate and reference-voltage transmission line L2, the potential of line L2 falls by 0.41 volts in accordance with equation (2). (Actually, this potential falls by a greater value since the sense amplifiers differ in characteristics.) Nonetheless, in this embodiment, the reference voltage Vrefc is 0.41-volts higher than the ordinary reference voltage of 1.6 volts. The margin of logical-level discrimination for column-address buffer circuit 14 is, therefore, broader by 0.41 volts. That is, the margin of determining the logical level of the input address signal Ain, which the buffer circuit 14 has, is broadened by 0.41 volts. (The logic "LOW" level of the input address signal Ain is −1 to +0.8 volts according to the specifications.) Thus, even if the potential of the reference-voltage transmission line L2 falls below 0.8 volts, a sufficiently broad margin of logical-level discrimination can be attained for the column-address buffer circuit 14 which becomes operative when this potential fall takes place. This can help to minimize the possibility that the address-buffer circuit 14 operates erroneously. As a result, the operating reliability of column-address buffer circuit 14 can be enhanced.

Thereafter, the row-address strobe signal $\overline{RAS}$ rises to logic "HIGH" level. Upon lapse of 40 nanoseconds after this, the bit line is charged. The substrate potential Vsub rises in accordance with equation (1). Subsequently, the potential of reference-voltage transmission line L1 increases by 0.41 volts in accordance with equation (2), because of the coupling capacitance between the substrate and line L1. (Actually, this potential rise is greater since the sense amplifiers differ in characteristics.) Nonetheless, the margin of determining the logical level of the input address signal Ain, which buffer circuit 14, is broadened by 0.41 volts since the reference voltage Vrefr for row-address buffer circuit 12 is 0.41 volts lower than the ordinary reference voltage of 1.6 volts. (The logic "HIGH" level of the input address signal Ain is set at 2.4 to 6.5 volts according to the specifications.) Thus, even if the DRAM enters into the next active cycle when the potential of line L2 rises above 2.4 volts, and row-address buffer circuit 12 becomes operative at the fall of the row-address strobe signal $\overline{RAS}$, a sufficiently broad margin of determining the logical level of the input address signal Ain can be provided for row-address buffer circuit 12. As a result, the operating reliability of row-address buffer circuit 12 can be improved.

The inventors hereof made 1-megabit DRAMs having reference voltage-generating circuit 10, and tested these DRAMs. We continuously measured the reference voltages Vrefr and Vrefc while each DRAM was operating, thereby recording how these reference voltages changed with time. The voltage changes are demonstrated in FIG. 2. In this figure, characteristic curve 30 represents how the reference voltage Vrefr for row-address buffer circuit 12 changed with time, and characteristic curve 32 indicates how the reference voltage Vrefc for column-address buffer circuit 14 changed with time. In this instance, both reference voltages Vrefr and Vrefc fell by 0.41 volts upon lapse of 30 to 40 nanoseconds after the row-address strobe signal RAS had fallen to low level. These voltages, Vrefr and Vrefc, remained 0.41 volts below their respective values of 1.19 volts and 2.01 volts during the period (indicated by arrow 34) for which column-address buffer circuit 14 was operating. Further, both reference voltages Vrefr and Vrefc rose by 0.41 volts upon lapse of 40 nanoseconds after the row-address strobe signal $\overline{RAS}$ had risen to high level. They remained 0.41 volts above their respective values of 1.19 volts and 2.01 volts during the period (indicated by arrow 36) for which row-address buffer circuit 12 was operating.

Figure 2:
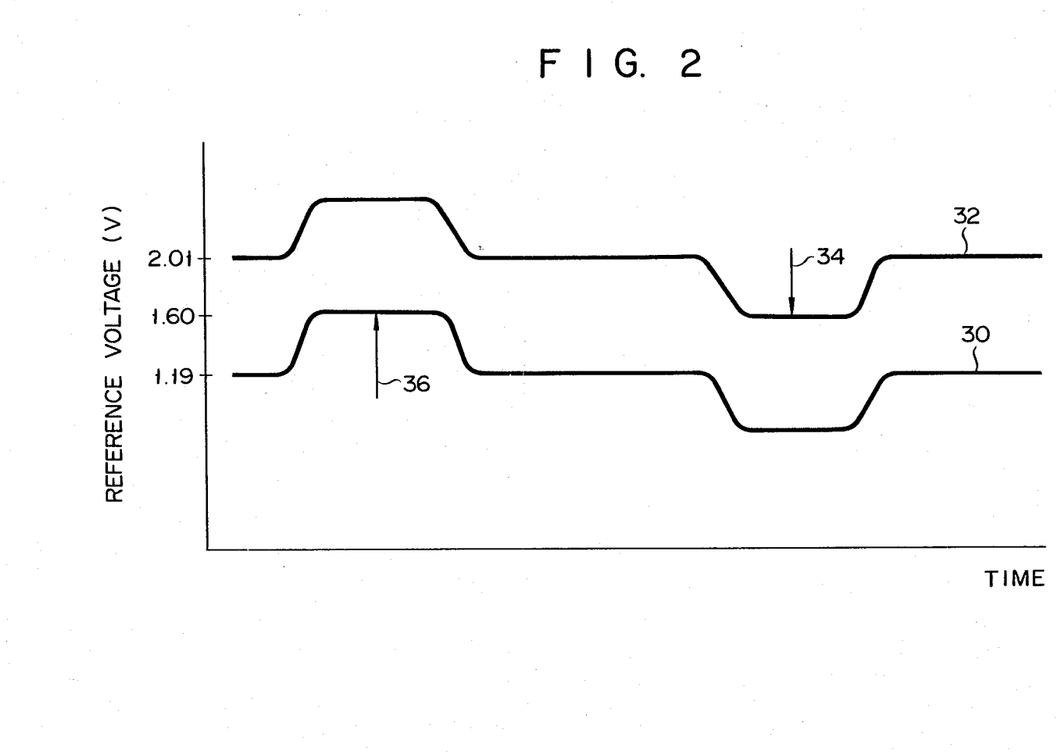
FIG. 2 is a graph showing how the two reference voltages generated by the reference voltage-generating circuit of FIG. 1 change with time.

In the DRAMs made for experimental purposes, the reference voltage Vrefr supplied via line L1 to row-address buffer circuit 12, which was 0.41 lower than the ordinary reference voltage (i.e., 1.6 volts). Hence, the margin of determining logic "HIGH" level and the margin of determining logic "LOW" level were equal as long as the reference voltage Vrefr remained 0.41 volts above its value (i.e., 1.91 volts) due to the substrate potential fluctuation $\Delta V_{sub}$. On the other hand, the reference voltage Vrefc supplied through line L2 to column-address buffer circuit 14, which was 0.41 volts higher than the ordinary reference voltage (i.e., 1.6 volts). Therefore, the margin of determining logic "HIGH" level and the margin of determining logic "LOW" level were equal as long as the reference voltage Vrefc remained 0.41 volts below its value (i.e., 2.01 volts) due to the substrate potential fluctuation $\Delta V_{sub}$. As a result, neither row-address buffer circuit 12 nor column-address buffer circuit 14 malfunctioned despite these fluctuations of the reference voltages Vrefr and Vrefc.

As has described above, in this embodiment, two different reference voltages Vrefr and Vrefc are supplied to row-address buffer circuit 12 and column-address buffer circuit 14. Hence, even if the potentials of reference-voltage transmission lines L1 and L2 rise because of an increase in the coupling capacitance between line L1 and the substrate and in the coupling capacitance between line L2 and the substrate, both address buffer circuits 12 and 14 can correctly operate. The DRAM of this invention can therefore not only have a high integration density, but also have a high operating reliability.

Moreover, since only one circuit (i.e., circuit 10) having series resistors suffices to provide two different reference voltages Vrefr and Vrefc, that area of the chip surface, which this circuit occupies is smaller than the area required fr two separate reference voltage-generating circuits. This fact helps to promote an efficient use of the chip surface. Further, unlike a DRAM wherein two separate circuits are used to produce two different reference voltages, it is possible in this embodiment to prevent the circuit characteristics from being deviated among DRAMs due to the fluctuations of process-parameters in the manufacturing process of DRAMs. This face facilitates to improve the uniformity of reference voltages Vrefr and Vrefc among DRAMs manufactured.

Figure 3:
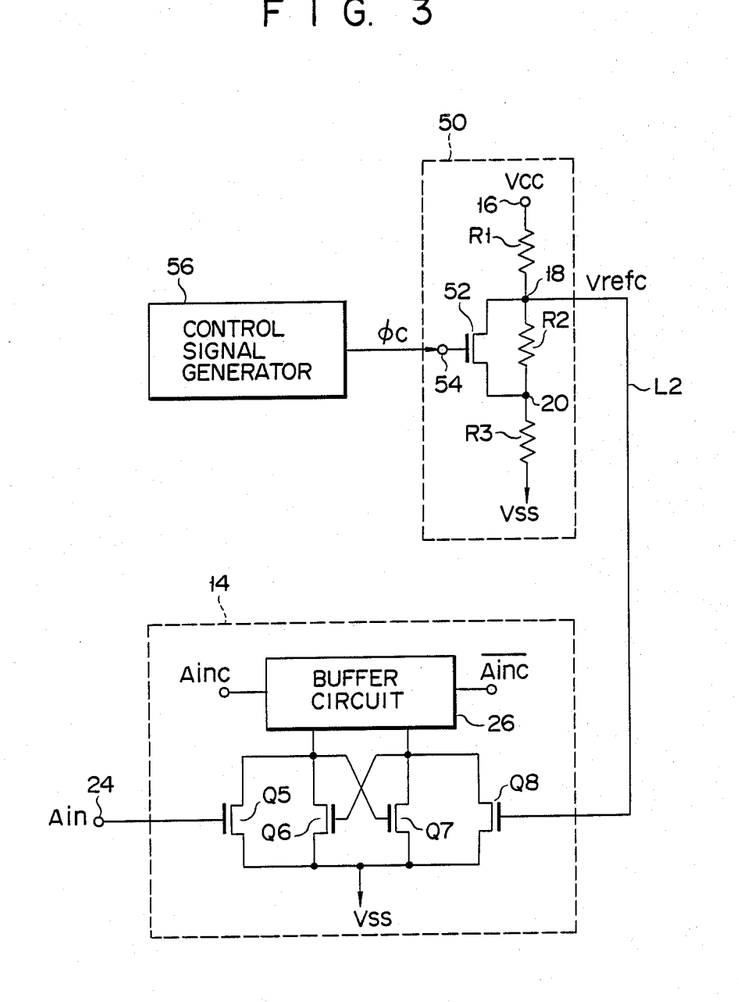
FIG. 3 is a diagram illustrating the major components of a second embodiment of the invention, i.e., a semiconductor dynamic random-access memory.

FIG. 3 shows the major components of a second embodiment of the present invention, i.e., another 1-megabit DRAM. This DRAM is designed for use in image data processing. It can operate in various modes other than normal mode and nibble mode. More precisely, this DRAM operates in high-speed page mode, static column mode, serial-data access mode, or the like. In this DRAM, while row-address strobe signal RAS is at logic "LOW" level, column-address signals are input, one after another, to the memory-cell matrix, thereby sequentially selecting a plurality of columns of memory cells. If the reference voltage Vrefc for column-address buffer has the ordinary value of 1.6 volts, it will inevitably rise to 2.01 volts because of an increase in the coupling-capacitance between the substrate and reference-voltage voltage transmission line L2. When column-address buffer circuit 14 become operative under this condition, column-address buffer circuit 14 has no margin for determining the logical levels of the first set of column-address signals Acl. Consequently, the error rate of buffer circuit 14 inevitably increases. The fluctuation ΔVrefc of reference voltage Vrefc disappear when the second set of column-address signals is input to the DRAM.

Reference voltage-generating circuit 50, which is shown in FIG. 3, comprises three resistors R1, R2 and R3 connected in series between a ground potential Vss and the terminal to which a power-supply voltage Vcc is applied, and one switching element 52 coupled in parallel to resistor R2. Switching element 52 may either be a FET or a bipolar transistor. In this embodiment, element 52 is an n-channel type FET. FET 52 has a source electrode coupled to node 18 of resistors R1 and R2, and a drain electrode coupled to node 20 of resistors R2 and R3. Line L2 for supplying a reference voltage Vrefc to column-address buffer circuit 14 is connected to node 18, as in the first embodiment shown in FIG. 1. The gate electrode of FET 52 is coupled to control terminal 54. Terminal 54 is connected to control signal generator 56 which includes a clock driver for producing a switching-control clock signal $\phi c$. Hence, FET 52 performs a switching operation in response to the clock signal $\phi c$ supplied from control signal generator 56.

When FET 52 is non-conductive, the reference voltage Vref given by the following equation is generated at node 20:

$$Vref = (Vcc - Vss)(R2 + R3)/(R1 + R2 + R3) \qquad (4)$$

This reference voltage Vref is supplied through reference-voltage transmission line L2 to column-address buffer circuit 14, and is used as the reference voltage Vrefc. The ground potential Vss is 0 volt. Therefore:

$$Vref = Vcc(R2 + R3)/(R1 + R2 + R3) \qquad (4')$$

When FET 52 is conductive, resistor R2 is bypassed by FET 52, whereby the reference voltage Vref changes to:

$$Vref = \frac{Vcc[R2\ Ron/(R2 + R3)]}{R1 + [R2\ Ron/(R2 + Ron)] + R3} \qquad (5)$$

where Ron is the on-resistance of FET 52. This reference voltage is supplied through line L2 to column-address buffer circuit 14 and is used as the reference voltage Vrefc. The on-resistance Ron of FET 52 can be rendered much lower than the resistance of resistor R2 merely by adjusting the potential level of clock signal $\phi c$. Hence, Ron may be regarded as approximately zero. Therefore, equation (5) can reduce to:

$$Vref = Vcc\ R3/(R1 + R3) \qquad (5')$$

As is evident from equation (5'), the resistance ratio among resistors R1, R2 and R3, which are coupled in series, changes when FET 52 is rendered conductive, and the output voltage Vrefc of reference voltage-generating circuit 50 therefore falls. In other words, the reference voltage Vrefc supplied to column-address buffer circuit 14 can be altered by switching FET 52 by means of control signal generator 56. In the DRAM of FIG. 3, the power-supply voltage Vcc is 5 volts. Resistors R1, R2 and R3 have such resistances that the output voltage Vrefc of circuit 50 falls to the ordinary value of 1.6 volts when FET 52 is conductive.

Figure 4A:
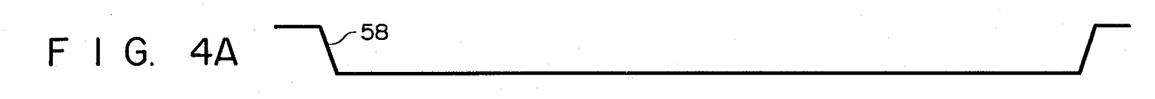
FIGS. 4A to 4E are diagrams showing the waveforms of the various signals generated by the major components of the memory shown in FIG. 3.
Figure 4B:
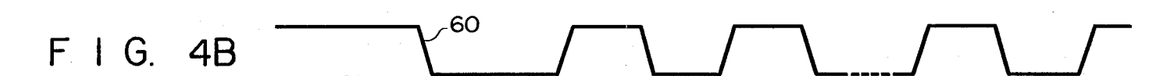
Figure 4C:
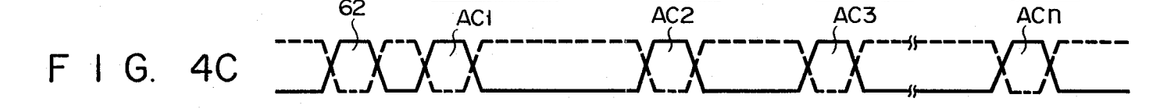
Figure 4D:
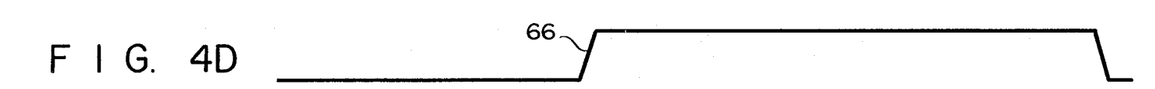

FIGS. 4A to 4E show the waveforms of the signals generated by some major components of the DRAM shown in FIG. 3. When the row-address strobe signal $\overline{RAS}$ externally supplied to the DRAM falls to logic "LOW" level as is shown by slope 58 in FIG. 4A, sense-amplifying operation on the bit lines starts. Upon lapse of 30 to 40 nanoseconds thereafter, the column-address strobe signal $\overline{CAS}$ also supplied to the DRAM falls to logic "LOW" level, as is indicated by slope 60 in FIG. 4B. The solid line and the broken line, both shown in FIG. 4C, represent an address-selecting signal $\phi s$ and another address-selecting signal $\overline{\phi s}$. Numeral 62 in FIG. 4C shows a row-address selection period, and symbol Acl also in FIG. 4C represents a period during which the first set of column addresses are input to the DRAM. FIG. 4D shows the waveform of the control signal $\phi c$ supplied to the gate electrode of switching FET 52.

As is clearly understood from FIG. 4D, the control signal $\phi c$ remains at logic "LOW" level as long as the column-address strobe signal CAS is at logic "LOW"

and, hence, as long as the first set of column addresses are input. Therefore, during this period, n-channel type FET 52 is kept non-conductive, and the reference voltage Vrefc generated by circuit 50 has a value 0.41 volts higher than the ordinary level of 1.6 volts, that is the value of 2.01 volts (See FIG. 4E). When the sense-amplifying operation on the bit lines starts, the potential of reference-voltage transmission line L2 temporarily falls due to the coupling capacitance between line L2 and the substrate of the DRAM, as is indicated by slope 64 shown in FIG. 4E. While the potential of line L2 is temporarily at such a low level, address buffer circuit 14 can be rendered operative. Even if so, column-address buffer circuit 14 has a sufficiently broad margin of discriminating logical levels.

Figure 4E:
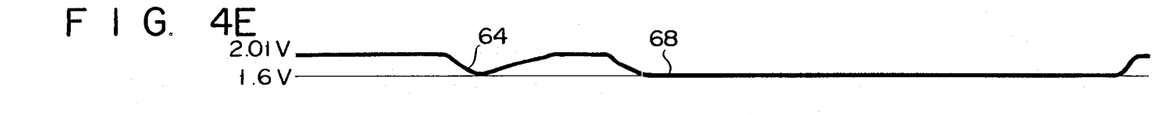

The temporary fluctuation ΔVrefc indicated at numeral 64 in FIG. 4E ceases to exist upon lapse of 100 nanoseconds after the fall "58" of row-address strobe signal $\overline{RAS}$. Then, the reference voltage Vrefc again rises to 2.01 volts. After the first set of column addresses have been input, clock signal generator 56 raises the level of signal φc to the high level, as is illustrated at numeral 66 in FIG. 4D. In response to this level change of signal φc, switching FET 52 becomes conductive, thus bypassing resistor R2. The reference voltage Vrefc falls to the ordinary level of 1.6 volts which is given by equation (5'), as is indicated by slope 68 in FIG. 4E. Thereafter, the second set of column addresses, and the subsequent sets of column addresses are supplied to address buffer circuit 14 during periods Ac2, Ac3, . . . Acn (FIG. 4C). During these periods Ac2, Ac3, . . . Acn, no fluctuation ΔVrefc of the reference voltage Vrefc occurs. Therefore, column-address buffer circuit 14 has two identical margins, one margin of discriminating the logic "HIGH" level, and the other margin of discriminating the logic "LOW" level, while it is comparing the column addresses of the second and some subsequent sets, with the reference voltage Vrefc of 1.6 volts. Since column-address buffer circuit 14 compares these column addresses with the reference voltage of the ordinary level (i.e., 1.6 volts), it can correctly determine the logical level of each of these column addresses.

Figure 5:
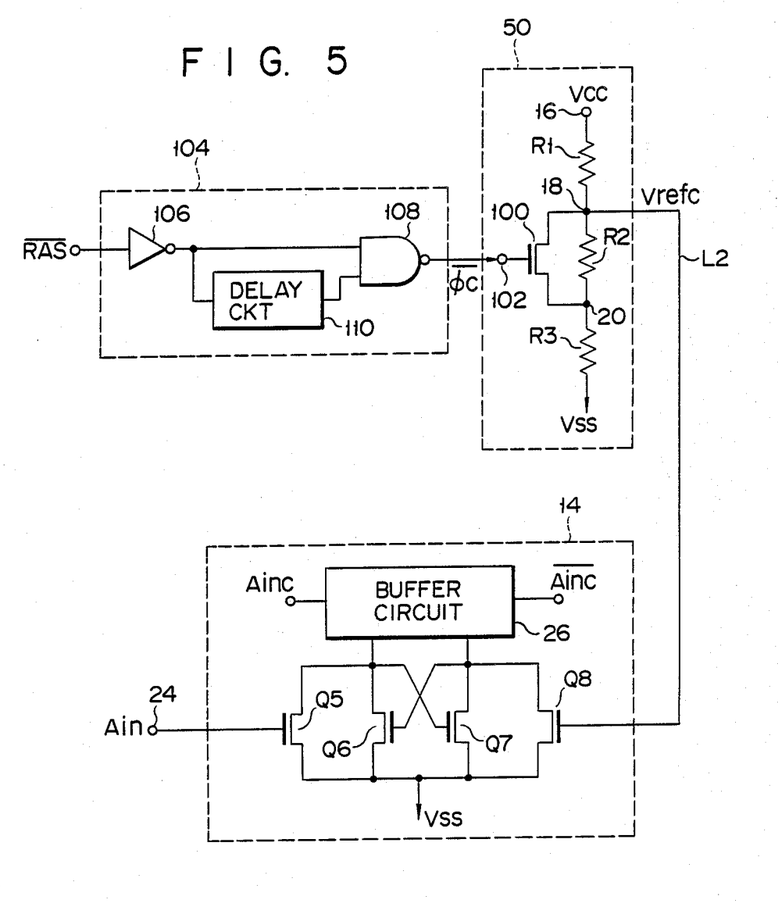
FIG. 5 is a diagram illustrating the major components of a third embodiment of the invention, i.e., another semiconductor dynamic random-access memory.

FIG. 5 shows some major components of another DRAM according to a third embodiment of the present invention. In FIG. 5, the same elements as those shown in FIG. 3 are designated by the same numerals. And these elements will not be described in detail. As is shown in FIG. 5, reference voltage-generating circuit 50 includes p-channel type FET 100 which functions as a switching element. FET 100 has gate electrode terminal 102 coupled to control signal generator 104. Resistors R1, R2 and R3 used in circuit 50 have such resistances that a voltage of 2.01 volts is generated at node 18 of resistors R1 and R2 when FET 100 is non-conductive, and a voltage of 1.6 volts (i.e., the ordinary reference level) is generated at node 20 of resistors R2 and R3.

When row-address strobe signal $\overline{RAS}$ is externally supplied to the DRAM, control signal generator 104 produces a switching-control clock signal φc in response to the row-address strobe signal $\overline{RAS}$. The clock signal φc is supplied to gate electrode terminal 102 of FET 100, and renders FET 100 non-conductive for a predetermined period of time. When FET 100 is non-conductive, FET 100 raises the reference voltage Vrefc for column-address buffer circuit 14. When the clock signal φc undergoes a level change, FET 100 is rendered conductive, and alters the resistance ratio among resistors R1, R2 and R3 which are connected in series, thereby lowering the reference voltage Vrefc for buffer circuit 14.

Control signal generator 104 includes inverter 106. Inverter 106 receives at its input the row-address strobe signal $\overline{RAS}$. The output of inverter 106 is coupled to the first input of 2-input NAND gate 108. It is also connected to delay circuit 110, the output of which is coupled to the second input of NAND gate 108. The output of NAND gate 108 is coupled to gate electrode terminal 102 of FET 100. The row-address strobe signal $\overline{RAS}$ is inverted by inverter 106. The output signal of inverter 106, RAS, is directly supplied to the first input of NAND gate 108, and also to delay circuit 110. Circuit 110 delays signal RAS by T. The delayed signal $\overline{RAS}$ is supplied to the second input of NAND gate 108.

Figure 6A:
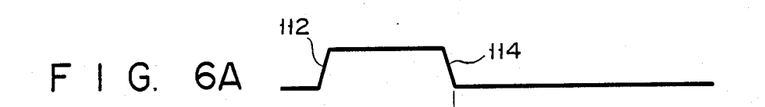
FIGS. 6A and 6B are diagrams showing the waveform of the row-address strobe signal input to the circuit for controlling the reference voltage-generating circuit provided in the memory of FIG. 5, and the waveform of the control clock signal supplied from this control circuit to the reference voltage-generating circuit.
Figure 6B:
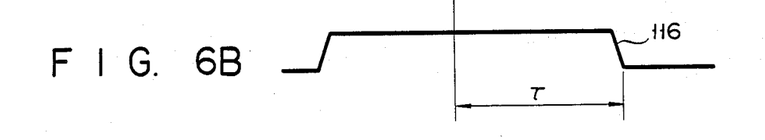

More specifically, when the row-address strobe signal $\overline{RAS}$ rises to logic "HIGH" level as is indicated by slope 112 in FIG. 6A, the output signal φc of NAND gate 108 also rises to logic "HIGH" level as is illustrated in FIG. 6B. This signal φc remains at logic "HIGH" level even after the row-address strobe signal $\overline{RAS}$ has fallen to logic "LOW" level as is indicated by slope 114 in FIG. 6A. It falls to logic "LOW" level as is shown by slope 116 in FIG. 6B upon lapse of the delay time τset by delay circuit 110 after the low-address strobe signal $\overline{RAS}$ has fallen to logic "LOW" level (See slope 114). Since FET 100 remains non-conductive during the delay time T, the reference voltage Vrefc for column-address buffer circuit 14 is at the high level of 2.01 volts. The delay time T is 100 nanoseconds, during which the reference voltage Vrefc can temporarily fall immediately after the row-address strobe signal $\overline{RAS}$ has fallen to logic "LOW" level as is represented by slope 114. Therefore, even if the potential of the line L2 temporarily falls by 0.41 volts during the delay time τ, the reference voltage Vrefc rises by 0.41 since FET 100 remains non-conductive, as can be clearly understood from equation (4'). Hence, the buffer circuit 14 can have a sufficiently broad margin of discriminating the logical levels of address signals. After the expiration of the period τ, the output signal of NAND gate 108, i.e., the clock signal φc, falls to logic "LOW" level. Hence, p-channel type FET 100 becomes conductive, whereby the reference voltage Vrefc on the line L2 falls back to the ordinary level of 1.6 volts. Therefore, the reference voltage Vrefc is at a low potential level corresponding to the ordinary potential level (1.6 volts) once the period of 100 nanoseconds has lapsed from the fall of the row-address strobe signal $\overline{RAS}$ to logic "LOW" level. In this case, too, column-address buffer circuit 14 can have two identical margins, one for discriminating logic "HIGH" level, and the other for discriminating logic "LOW" level.

Figure 7:
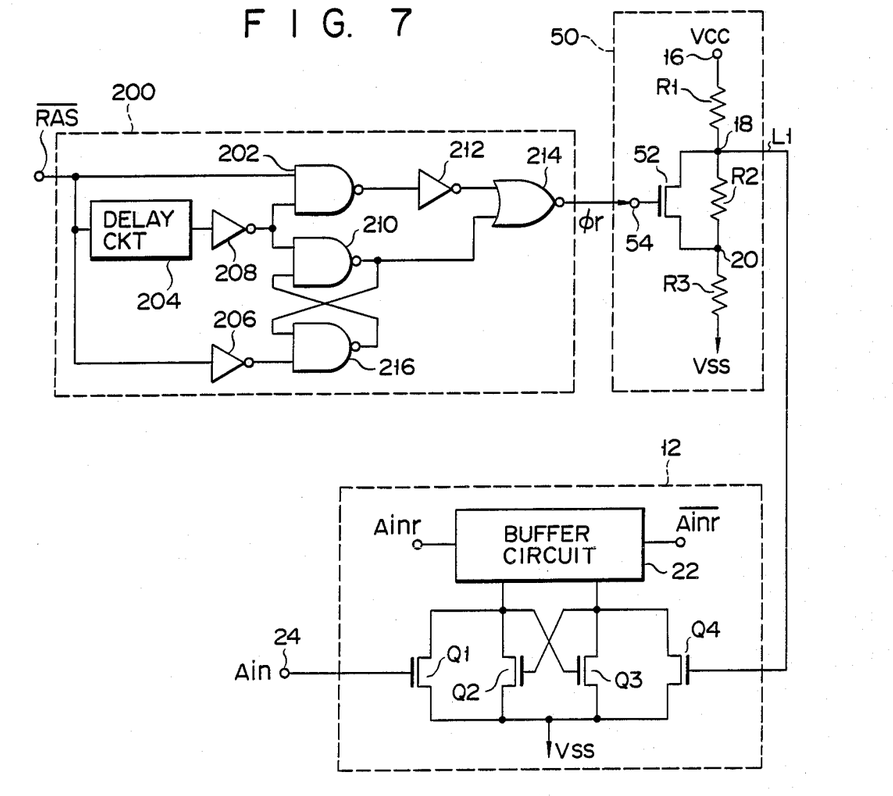
FIG. 7 is a diagram showing the major components of a fourth embodiment of the invention, i.e., still another semiconductor dynamic random-access memory.

Reference voltage-generating circuit 50 of the present invention can be applied to row-address buffer circuit 12, too, as in a fourth embodiment of the invention, which is shown in FIG. 7. Referring to FIG. 7, n-channel type FET 52 of reference voltage-generating circuit 50 is connected at gate electrode terminal 54 to control signal generator 200. Control signal generator 200 receives a row-address strobe signal $\overline{RAS}$ and produces a switching-control clock signal φr. In this embodiment, serially connected resistors R1, R2 and R3 have such resistances that a voltage of 1.6 volts (i.e., the ordinary potential level) is generated at node 18 of resistors R1 and R2, and a voltage of 1.19 volts (i.e., adjusted low potential level) is generated at node 20 of resistors R2 and R3, when FET 52 is non-conductive.

In control signal generator 200, the row-address strobe signal $\overline{RAS}$ in supplied to the first input of 2-input NAND gate 202, to delay circuit 204, and also to inverter 206. The output of delay circuit 204 is coupled by inverter 208 to the second input of NAND gate 202, and also to the second input of 2-input NAND gate 210. The output of NAND gate 202 is coupled by inverter 212 to the first input of 2-input NOR gate 214. The output of NAND gate 210 is connected to the second input of NOR gate 214. The output of NAND gate 210 is coupled to the first input of NAND gate 216. The output of inverter 206 is coupled to the second input of NAND gate 216. The output of NAND gate 216 is connected to the second input of NAND gate 210.

Figure 8A:
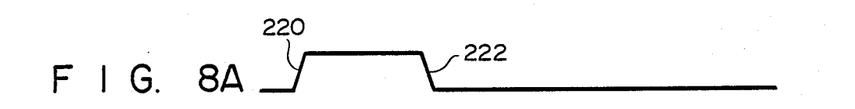
FIGS. 8A and 8B are diagrams showing the waveform of the row-address strobe signal input to the control circuit for controlling the reference voltage-generating circuit provided in the memory of FIG. 7, and the waveform of the control clock signal supplied from this control circuit to the reference voltage-generating circuit.

The row-address strobe signal $\overline{RAS}$ rises to logic "HIGH" level as is indicated by slope 220 in FIG. 8A. Upon lapse of 40 nanoseconds thereafter, the lines (not shown) of the DRAM are charged. At this time, the substrate potential Vsub changes. Consequently, the reference voltage Vrefr on line L1 rises by 0.41 volts as can be understood from equation (3). Nonetheless, the margin of discriminating the logical levels of address signals, which is provided for row-address buffer circuit 12, is not narrowed since FET 52 becomes conductive, thus raising the reference voltage Vrefr by 0.41 volts in accordance with equation (5').

Figure 8B:
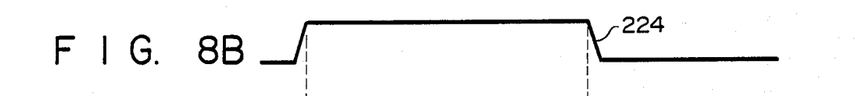

More precisely, when the row-address strobe signal $\overline{RAS}$ rises as is shown by slope 222 in FIG. 8a, the output signal $\phi r$ of NOR gate 214 also rises to logic "HIGH" level as is illustrated in FIG. 8B. Upon lapse of the delay time $\tau$(100 nanoseconds) set by delay circuit 204 from the rise of the row-address strobe signal RAS (indicated by slope 220), the output signal $\phi r$ of NOR gate 214 falls to logic "LOW" level (See slope 224 shown in FIG. 8A). During the delay time $\tau$, n-channel type FET 52 is conductive. Therefore, a voltage Vrefr of 1.19 volts, which is 0.41 volts lower than the ordinary potential level (1.6 volts) given by equation (5'), is supplied to row-address buffer circuit 12 during this period of time ($\tau$). Hence, row-address buffer circuit 12 can have a sufficiently broad margin of discriminating the logical levels of address signals also during this period of time ($\tau$) even if the potential of line L1 temporarily rises by 0.41 volts. This temporary, potential rise on line L1 is cancelled out by the decrease (0.41 volts) of the reference voltage Vrefr.

When the period $\tau$expires, the output signal $\phi r$ of NAND gate 104 changes to logic "LOW" level. FET 52 thereupon becomes non-conductive. The potential of line L1 therefore rises to the ordinary level of 1.6 volts. In other words, the reference voltage Vref is no longer deviated from its ordinary level. At this time, the reference voltage Vrefc for column-address buffer circuit 14 is also at the ordinary level of 1.6 volts. In this case, too, row-address buffer circuit 12 has two identical margins, one for discriminating logic "HIGH" level, and the other for discriminating logic "LOW" level.

Figure 9A:
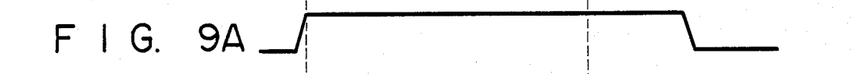
FIGS. 9A and 9B are diagrams showing the waveform of the modified row-address strobe signal input to the control circuit for controlling the reference voltage-generating circuit provided in the memory of FIG. 7, and the waveform of the control clock signal supplied from the control circuit to the reference voltage-generating circuit.
Figure 9B:
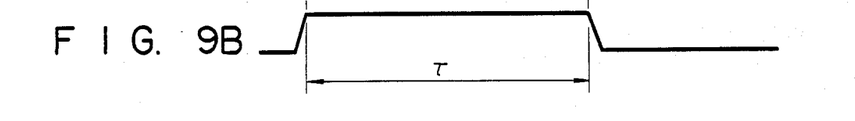

It should be noted that the delay time $\tau$, during which the signal $\phi r$ remains at the low level, is constant, regardless of the time (i.e., slope 222) the row-address strobe signal $\overline{RAS}$ falls to logic "LOW" level. That is, the delay time has nothing to do with the precharge period of the DRAM. Hence, even if the row-address strobe signal $\overline{RAS}$ remains at logic "HIGH" level for a long time, as is illustrated in FIG. 9A, the period, during which the signal $\phi r$ stays at low level, remains unchanged as shown in FIG. 9B.

Although the invention has been described with reference to specific embodiments, it shall be understood by those skilled in the art that numerous modifications can be made that are within the spirit and scope of the inventive contribution.

Figures 10, 11A:
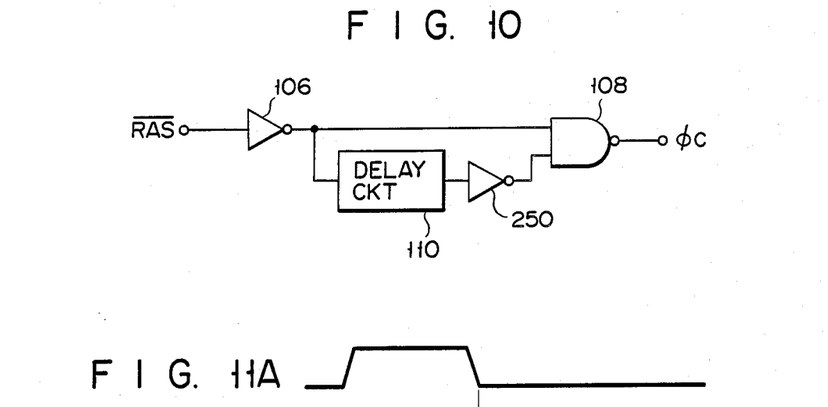
FIG. 10 is a circuit diagram of a first modification of the control circuit shown in FIG. 5.
FIGS. 11A and 11B are diagrams showing the waveform of the row-address strobe signal input to the control circuit of FIG. 10, and the waveform of the control clock signal output from this control circuit.
Figure 11B:
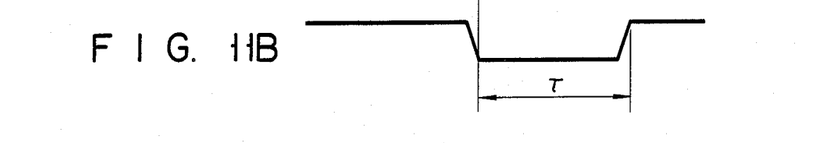

The control signal generator, which serves to switch the level of the reference voltage Vrefc, is not limited to the circuit configuration shown in FIG. 5. As is illustrated in FIG. 10, it can be comprised of inverter 106, 2-input NAND gate 108 whose first input is coupled to the output of inverter 106, delay circuit 110 whose input is coupled to the output of inverter 106, and inverter 250 connected between the output of delay circuit 110 and the second input of NOR gate 108. In this case, n-channel type MOSFET 52 is used as the switching element of the reference voltage-generating circuit 50 (FIG. 5). Since the output signal of delay circuit 110 is inverted by inverter 250, the control clock signal $\phi c$ output by NAND gate 108 is at logic "LOW" level during the period $\tau$after the row-address strobe signal $\overline{RAS}$ has fallen from logic "HIGH" level to logic "LOW" level as is shown in FIG. 11A. During this period $\tau$, n-channel type FET 52 remains non-conductive, and the reference voltage Vrefc stays at the adjusted high potential level of 2.01 volts, which is 0.41 volts higher than the ordinary potential level of 1.6 volts.

Figure 12:
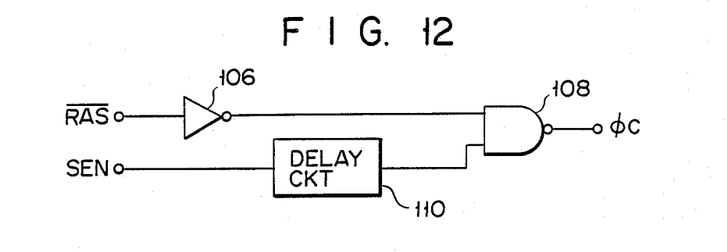
FIG. 12 is a circuit diagram of a second modification of the control circuit shown in FIG. 5.
Figure 13A:
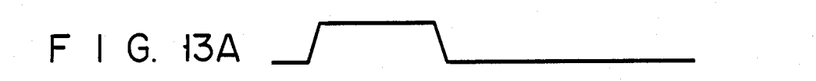
FIGS. 13A to 13C are diagrams showing the waveform of the row-address strobe signal input to the control circuit of FIG. 12, the waveform of the sense amplifier-driving signal also input to the control circuit, and the waveform of the clock control signal output from the control circuit.
Figure 13B:
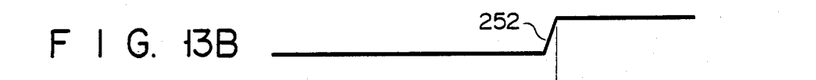
Figure 13C:
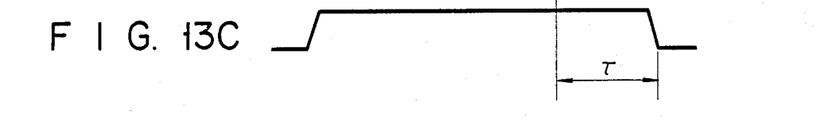

Furthermore, control signal generator 104 shown in FIG. 5 can be replaced by the modification shown in FIG. 12, which supplies delay circuit 110 (FIG. 5) with a drive signal SEN for driving a bit-line sense amplifier (not shown) of the known type. When this modification is used, p-channel type MOSFET 100 is used as the switching element of circuit 50. In this case, a sence-amplifier drive signal SEN is input to delay circuit 110. Therefore, the time the clock signal $\phi c$ for controlling FET 52 falls to logic "LOW" level is determined with the time (i.e., slope 252 shown in FIG. 13B) used as a reference. At this time (i.e., slope 252), the drive signal SEN rises to logic "HIGH" level. In other words, FET 100 is rendered non-conductive upon lapse of the delay time $\tau$set by delay circuit 110 from the rise of the drive signal SEN. When FET 100 is thus made non-conductive, the reference voltage Vrefc is changed from the adjusted high level of 2.01 volts back to the ordinary potential level of 1.6 volts. The control signal generator of FIG. 12 can also compensate for a fluctuation $\Delta$Vrefc, if any, of the reference voltage Vrefc.

What is claimed is:

1. A semiconductor integrated circuit device provided on a semiconductive chip substrate, said device comprising:

first semiconductor transistor-circuit means, for receiving a first input voltage and determining a logical level of said first input voltage;

second semiconductor transistor-circuit means, for receiving a second input voltage and determining a logical level of said second input voltage; and voltage-generating means connected to said first semiconductor transistor-circuit means by elongated wiring lines, for receiving a power-supply voltage and constantly generating different voltages lower than said power-supply voltage, said different voltages being supplied as first and second semiconductor transistor-circuit means, respectively, and said voltage-generating means including resistive elements connected in series and having nodes at which said first and second reference voltages are generated.

2. The device according to claim 1, which is a semiconductor random-access memory, wherein said first and second semiconductor transistor-circuit means function as a row-address buffer circuit and a column-address buffer circuit.

3. A semiconductor integrated circuit device provided on a semiconductive chip substrate comprising:

semiconductor transistor-circuit means for receiving a first input voltage and determining a logical level of said first input voltage; and voltage-generating means connected by an elongated wiring line to said semiconductor transistor-circuit means, for receiving a power-supply voltage and producing a reference voltage which changes between two potential levels lower than said power-supply voltage, and which is supplied to said semiconductor transistor-circuit means, said voltage-generating means comprising:

resistive elements connected in series and having a first node at which a first voltage at an ordinary reference level is generated, and a second node at which a second voltage at a potential level is adjusted in accordance with a potential deviation generated on said wiring line, and a switching transistor connected to said nodes of said resistive elements, for changing its electrical condition, within a period during which said potential deviation occurs on said wiring line, in such a manner that said second node is connected to said semiconductor transistor-circuit means, thereby to supply said second voltage as said reference voltage to said semiconductor transistor-circuit means.

4. The device according to claim 3, wherein said second circuit means produces the reference voltage which has a potential level adjusted to compensate for the potential deviation on the wiring line.

5. The device according to claim 3, further comprising:

control circuit means connected to said switching transistor, for setting said switching transistor in a first electrical condition when said device is in an active mode and said semiconductor transistor-circuit means is first rendered operative for the first time, thereby to supply said second voltage to said semiconductor transistor-circuit means, and for setting said switching transistor in a second electrical condition when said semiconductor transistor-circuit means is rendered operative thereafter, thereby to supply said first voltage to said semiconductor transistor-circuit means.

6. The device according to claim 3, further comprising:

control circuit means connected to said switching transistor, for receiving an externally supplied electric signal, for detecting a potential change of said electric signal, for setting said switching transistor in a first electrical condition for a predetermined period from said potential change of said electric signal, thereby to supply said second voltage to said semiconductor transistor-circuit means, and for setting said switching transistor in a second electrical condition after the expiration of said predetermined period, thereby to supply said first voltage to said semiconductor transistor-circuit means.

7. The device according to claim 6, wherein said control circuit means includes a delay circuit.

8. A semiconductor device having a substrate, first circuit means provided on said substrate for receiving an input voltage and for determining a logical level of the input voltage, and second circuit means provided on said substrate and connected to said first circuit means by a wiring line formed on said substrate, for receiving a power supply voltage to produce a voltage which is lower than the power-supply voltage and which is supplied to said first circuit means as a reference voltage used to determine the logical level of the input voltage, the improvement wherein said first circuit means comprises:

first address buffer means connected to an input, for receiving an input address signal externally supplied thereto at the input; and second address buffer means connected to the input, for receiving the input address signal at said input, wherein said first circuit means comprises:

a voltage generating circuit which generates first and second reference voltages at different d.c. potential levels which are lower than the power-supply voltage, said first reference voltage being supplied to said first address buffer means, said second reference voltage being supplied to said second address buffer means, and wherein said first address buffer means compares the input address signal with said first reference voltage to produce an internal address signal, while said second address buffer means compares the input address signal with said second reference voltage to produce an internal address signal.

9. The device according to claim 8, further comprising:

first wiring line connected to said first circuit means and said first buffer means, for supplying said second buffer means with the first reference voltage; and second wiring line connected to said first circuit means and said second buffer means, for supplying said second buffer means with the second reference voltage.

10. The device according to claim 9, wherein said first address buffer means comprises a row-address buffer circuit for producing an internal row-address signal, and wherein said second address buffer means comprises a column-address buffer circuit for producing an internal column-address signal.

11. The device according to claim 10, wherein said first reference voltage is higher than an ordinary reference potential level, by a predetermined voltage which is substantially equal to the value given by:

$$\Delta V_{sub} \times r_c$$

where $\Delta V_{sub}$ is the fluctuation of the potential of said substrate, and $r_c$ is the coupling capacitance between said wiring lines and said substrate.

12. The device according to claim 11, wherein said second reference voltage is lower than said ordinary reference potential level, by said predetermined voltage.

13. The device according to claim 12, wherein said voltage-generating circuit comprises a voltage-dividing circuit including series resistors having nodes coupled to said row-address buffer circuit and said column-address buffer circuit, for constantly providing said first and second reference voltages.

14. A semiconductor device having a substrate, first circuit means provided on said substrate for receiving an input voltage and for determining a logical level of the input voltage, and second circuit means provided on said substrate and connected to said first circuit means by a wiring line formed on said substrate, for receiving a power-supply voltage to produce a voltage which is lower than the power-supply voltage and which is supplied to said first circuit means as a reference voltage used to determine the logical level of the input voltage, the improvement wherein said second circuit means comprises:

a voltage generating circuit for generating a reference voltage whose potential level is changeable and lower than the power-supply voltage, and wherein said first circuit means comprises an address buffer circuit connected to said voltage generating circuit, for receiving an externally supplied input address signal and the reference voltage, and for comparing the input address signal with the reference signal, to thereby produce an internal address signal.

15. The device according to claim 14 wherein said voltage-generating circuit comprises:

a resistance-dividing circuit receiving said power-supply voltage at one end and ground voltage at the other end, and including series resistors having nodes for constantly providing a first voltage, at an ordinary reference potential level, and a second voltage, different from said first voltage and adjusted to compensate for a temporary potential deviation on said wiring line;

a switching transistor connected to the nodes of said series resistors; and control circuit means connected to said switching transistor, for driving said switching transistor sch that said transistor changes its electrical condition to cause the first and second reference voltages to be alternatively supplied to said address buffer circuit.

16. The device according to claim 15, wherein said control circuit means controls said switching transistor such that said transistor switches, at a prescribed time when a potential deviation occurs on said wiring line, to cause said resistance-dividing circuit to supply said second voltage to said address buffer circuit, instead of said first voltage.

17. The device according to claim 16, wherein said second voltage is different from said first voltage at said ordinary reference potential level, by a predetermined voltage which is substantially equal to the value given by:

$$\Delta V_{sub} \times rc$$

where $\Delta V_{sub}$ is the potential fluctuation of said substrate, and rc is the coupling capacitance between said wiring line and said substrate.

18. The device according to claim 16, wherein said control circuit means receives an externally supplied signal to said device, and drives said transistor to change the electric condition thereof upon lapse of a predetermined time after the potential level of said signal has changed to a prescribed value, said predetermined time being so set as to define a specific length of time during which said temporary potential deviation on said wiring line occurs.

19. The device according to claim 18, wherein said control circuit means includes a delay circuit.

20. The device according to claim 19, wherein said second voltage is higher than said first voltage at said ordinary reference potential level, by a predetermined voltage which is substantially equal to the value given by:

$$V_{sub} \times rc$$

where $V_{sub}$ is the potential fluctuation of said substrate, and rc is the coupling capacitance between said wiring line, and said substrate.

21. The device according to claim 19, wherein said second voltage is lower than said first voltage at said ordinary reference potential level, by a predetermined voltage which is substantially equal to the value given by:

$$V_{sub} \times rc$$

where $V_{sub}$ is the potential fluctuation of said substrate, and rc is the coupling capacitance between said wiring line and said substrate.

* * * * *